United States Patent [19]

Pyle

[11] 4,401,839

[45] Aug. 30, 1983

[54] SOLAR PANEL WITH HARDENED FOIL BACK LAYER

[75] Inventor: Bruce D. Pyle, Chatsworth, Calif.

[73] Assignee: Atlantic Richfield Company, Los Angeles, Calif.

[21] Appl. No.: 331,119

[22] Filed: Dec. 15, 1981

[51] Int. Cl.³ .................................... H01L 31/04
[52] U.S. Cl. .............................. 136/251; 136/259
[58] Field of Search ............. 136/251, 259, 244, 245

[56] References Cited

U.S. PATENT DOCUMENTS

| 3,586,541 | 6/1971 | Chamberlin | 136/206 |
| 3,620,847 | 11/1971 | Wise | 136/244 |
| 3,658,596 | 4/1972 | Osborne | 136/251 |
| 4,231,807 | 11/1980 | Keeling et al. | 136/251 |
| 4,371,739 | 2/1983 | Lewis et al. | 136/251 |

FOREIGN PATENT DOCUMENTS 2466865 4/1981 France ............................. 136/251

OTHER PUBLICATIONS

H. S. Rauschenbach, "Solar Cell Array Design Handbook", Van Nostrand Reinhold Co., (1980), pp. 314–319, 324, 330–336.

Primary Examiner—Aaron Weisstuch
Attorney, Agent, or Firm—Nilsson, Robbins, Dalgarn, Berliner, Carson & Wurst

[57] ABSTRACT

A solar panel has at least one solar cell and a sheet of hardened aluminum foil underlying the cell. The panel preferably has a rigid transparent sheet above the cell, the foil sheet being bonded to the cell and to the transparent sheet. The foil sheet may be substantially continuous and provide a hermetic seal near the lower surface of the panel.

11 Claims, 3 Drawing Figures

SOLAR PANEL WITH HARDENED FOIL BACK LAYER

RELATED APPLICATION

The present invention is related to a copending United States patent application Ser. No. 311,816, filed Oct. 16, 1981, entitled "Terminal Assembly for Solar Panels", now U.S. Patent No. 4,371,739. It is commonly owned with the present application. The disclosure therein is hereby incorporated by reference.

BACKGROUND OF THE INVENTION

This invention relates generally to the solar panel art and, more particularly, to an improved solar panel with a hardened aluminum foil back layer.

Solar panels having front layers of glass or other rigid transparent material have been provided with aluminum foil layers to hermetically seal the back of the panel. As far as applicant is aware, the use of aluminum foil in such panels has been limited to common annealed or dead soft foil of the type used in most packaging applications. The foil is typically bonded to the transparent outer layer through a plurality of solar cells and at least one dielectric layer. Because glass has a much lower thermal expansion coefficient than the metal used to form the foil layer, substantial stresses are placed on the foil when the solar panel is exposed to extreme temperatures during use. In many panels using annealed aluminum foil layers, the stresses applied to the foil during thermal cycling are sufficient to stretch it beyond its elastic limit. The foil can then buckle and pull away from the other components of the panel, or can form pin holes and stress cracks which spoil the hermetic sealing properties of the foil.

While some of the problems discussed above are eliminated when steel foil is used in the back layer, it is much more expensive than aluminum foil and is less readily available commercially. Steel foil is also more difficult to form into the thin sheets desired for use in solar panels and has a much greater tendency to corrode.

Therefore, in many applications it is desirable to provide a solar panel having an inexpensive sealing back layer which will not buckle in use when placed in conjunction with a front layer having a relatively low thermal expansion coefficient.

SUMMARY OF THE INVENTION

The present invention comprises a solar panel having at least one solar cell and a sheet of hardened aluminum foil behind the cell and bonded thereto. The cell may have a rigid transparent sheet overlying the cell, to which the foil sheet is also bonded. The foil sheet is preferably substantially continuous and provides a hermetic seal along a portion of the back surface of the panel. The foil sheet is preferably made of either half hard or full hard aluminum, and the solar cell is at least partially embedded in a dielectric layer of plasticized polyvinyl butyral (PVB) or ethylene vinyl acetate (EVA). The foil sheet is then bonded to the cell through the dielectric layer. The foil sheet may be laminated between a pair of dielectric sheets and may be grounded to an electrically conductive peripheral frame of the solar panel.

The utilization of hardened aluminum foil in the present invention substantially increases the yield strength of the back layer without increasing the expense or thickness thereof. The back layer of the present invention is thus able to withstand the substantial stresses caused by different rates of thermal expansion of the panel components. It does not yield under the stress or develop pin holes or cracks, eliminating the problems of buckling and loss of hermetic seal. The cells of the panel remain fully isolated from the environment.

The stresses developed within the panel are primarily due to the fact that aluminum expands and contracts at a rate of approximately $23 \times 10^{-6}$ per degree Celsius, while glass expands and contracts at a rate of less than $9 \times 10^{-6}$ per degree Celsius. When a back layer containing aluminum is laminated to a glass front layer through a plastic pottant material such as PVB or EVA, any change in temperature of the panel will cause stress between the aluminum and the glass. Because the initial lamination process takes place at an elevated temperature, the layers of aluminum and glass become equilibrated upon cooling when the PVB or EVA pottant solidifies to a point at which it firmly grips the two elements. This occurs at the "glass transition temperature" of the pottant, which is approximately 18 degrees Celsius for plasticized PVB. If the panel is subsequently exposed to lower temperatures during use, the aluminum back layer tends to contract at a much greater rate than that of the glass front layer. Because the glass is much stronger than the thin aluminum foil, the aluminum is subjected to very substantial tensile stresses. If the temperature of the panel is raised to a value greater than the glass transition temperature of the pottant, the glass layer tends to restrain the natural thermal expansion of the aluminum. However, at these elevated temperatures the PVB or other pottant material becomes more easily deformable and tends to dampen the stress between the glass and the aluminum. It is therefore believed that the stresses of primary importance herein are the tensile stresses experienced by the aluminum foil at temperatures below the glass transition temperature of the pottant.

The substantial yield strengths of the hardened aluminum foil layers of the present invention enable the layers to withstand stresses produced by temperature variations within a preselected wide range, eliminating the problems of buckling and loss of hermetic seal described above. For example, full hard aluminum foil of the type 1100 has a published yield stress of 22,000 psi at 24 degrees Celsius while annealed foil of the same type has a published yield stress of 5,000 psi. This difference is reflected in other types of aluminum foil and is responsible for many of the advantageous thermal cycling properties of the panel of the present invention.

BRIEF DESCRIPTION OF THE DRAWINGS

The above and other objects of the present invention may be more fully understood from the following detailed description taken together with the accompanying drawings wherein similar reference characters refer to similar elements throughout and in which.

DESCRIPTION OF THE PREFERRED EMBODIMENTS

Figure 1:
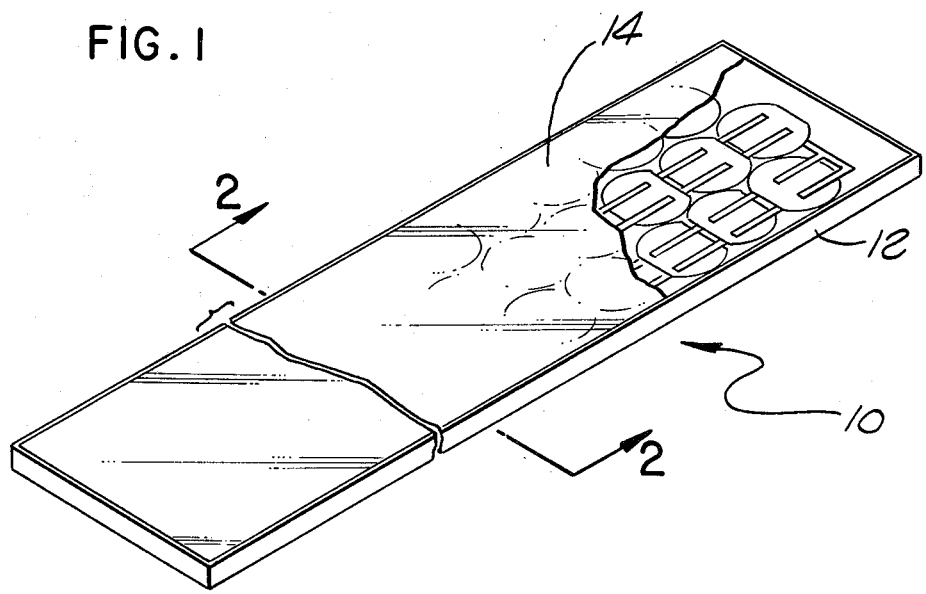
FIG. 1 is a perspective view of a solar panel constructed in accordance with the present invention.
Figure 3:
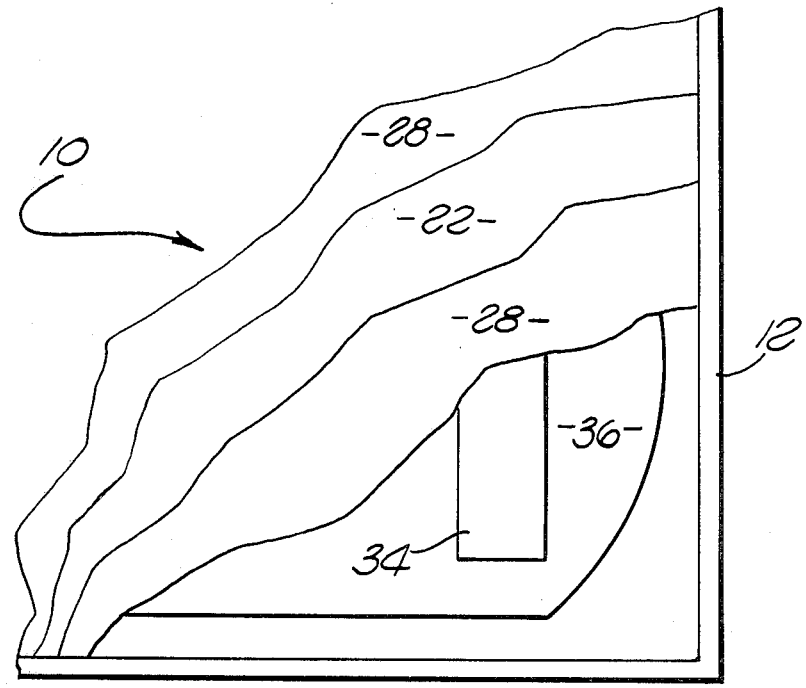
FIG. 3 is an enlarged fragmentary bottom plan view of a corner of the solar panel of FIG. 1, partially broken away.
Figure 2:
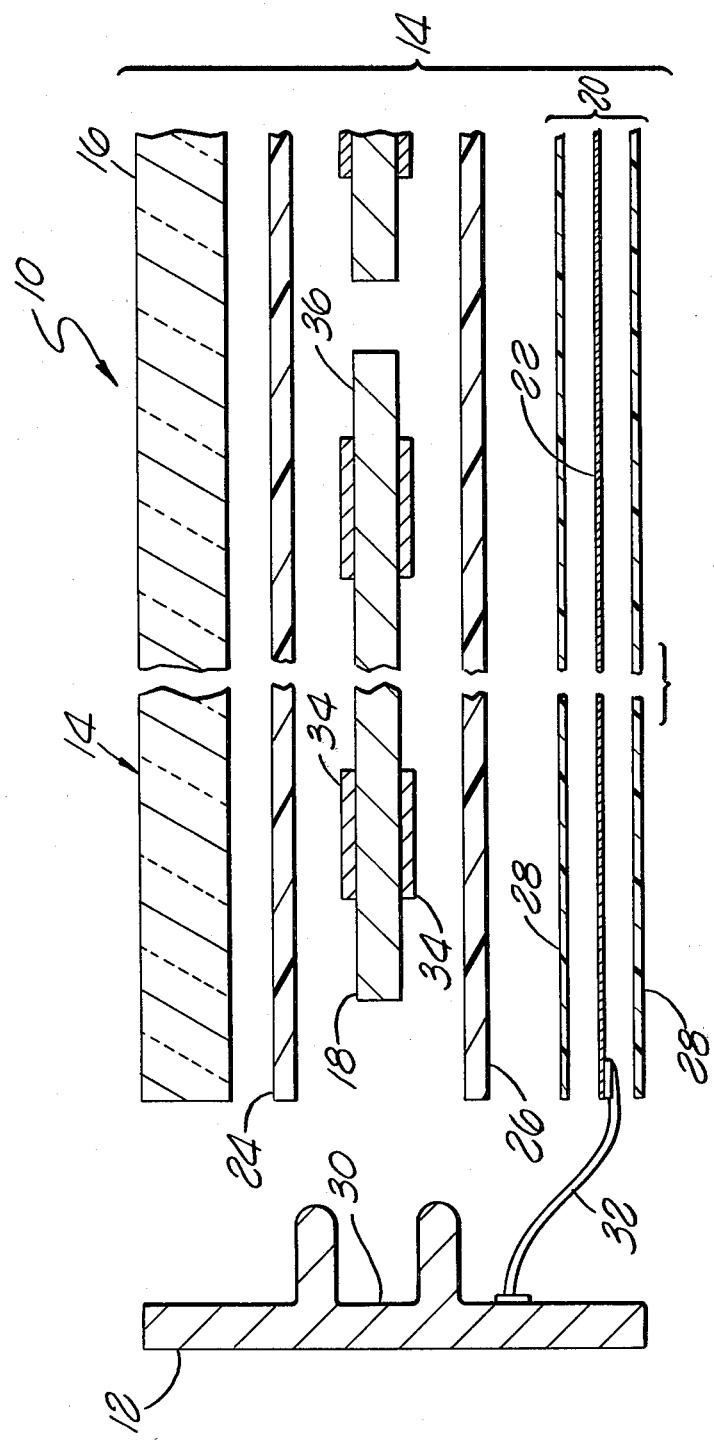
FIG. 2 is a fragmentary exploded vertical sectional view taken in the direction 2—2 of FIG. 1.

Referring now to the drawings, there is illustrated in FIGS. 1, 2 and 3, a solar panel constructed in accordance with the present invention, generally designated 10. The solar panel 10 comprises generally a peripheral frame 12 and a laminated central panel 14. The central panel 14 includes a glass front layer 16, an array of solar cells 18 and a back layer 20 containing a hardened aluminum foil sheet 22. A pair of dielectric pottant layers 24 and 26 are positioned on either side of the solar cells 18 to essentially encapsulate the solar cells and bond the glass layer 16 and the back layer 20 thereto. The foil sheet 22 of the back layer 20 is itself sandwiched between a pair of sheets 28 of high dielectric strength.

The peripheral frame 12 may be formed of extruded aluminum or other suitable material for supporting the central panel 14 during use. The central panel 14 is received within a recessed portion 30 of the frame 12, the foil sheet 22 preferably being grounded to the frame 12 by a suitable conductor 32. The electrical potential of the foil sheet 22 is thus maintained constant at zero.

The solar panel 10 is manufactured as a laminate, with the various layers thereof built up sequentially from the glass front layer 16. However, the dielectric sheets 28 are typically prelaminated to the foil sheet 22 to form the single back layer 20. The array of solar cells 18 is also prefabricated by application of a plurality of conductive ribbons 23 which interconnect individual solar cells 36.

During assembly, the glass front layer 16 is used as a support for the various layers prior to lamination. The dielectric pottant layer 24, the array of solar cells 18 and the pottant layer 26 are placed in sequence over the glass layer 16, followed by the back layer 20. The resulting stack of layers is then heated to a temperature sufficient to melt the pottant layers 24 and 26, and the stack is pressed together to produce lamination. In this process, the pottant layers are forced against the array of solar cells 18 to fill the voids therein and bond the glass layer 16 and the back layer 20 thereto. In the case of pottant layers made of PVB, the temperature of lamination may be approximately 149 degrees Celsius.

The sheets 28 of the back layer 20 may be formed of any material having a high resistance to weathering and a relatively high dielectric strength. One such material is white polyvinyl fluoride resin formed into an oriented film approximately 1.5 mils thick. If desired, a further sheet of even greater dielectric strength may be positioned between the inner sheet 28 and the aluminum foil sheet 22 to move effectively isolate the foil sheet 22 from the solar cells. A synthetic polyester film such as polyethylene terephthalate is ideal for these purposes. A suitable adhesive can be added to bond the polyester film to the sheet 28 and the foil 22.

The conductor 32 may be soldered or otherwise connected to the foil sheet 22 prior to lamination of the back layer. Connection of the conductor 32 to the frame 12 can be made following lamination of the central panel 14 and assembly of the central panel within the frame.

External electrical connection to the array of solar cells 18 can be made by any suitable terminal means (not shown), such as that disclosed in the above-referenced U.S. Pat. No. 4,371,739, entitled "Terminal Assembly for Solar Panels".

As described above, lamination of the central panel 14 takes place at an elevated temperature, causing the glass layer 16 and the back layer 20 to be equilibrated in length when the dielectric pottant material of the layers 24 and 26 cools to its glass transition temperature. This temperature is approximately 18 degrees Celsius in the case of plasticized PVB. When the temperature of the panel varies from this temperature, the various layers tend to expand or contract at different rates. This causes a buildup of stress in the direction of the layers. The hardened aluminum foil of the present invention is able to withstand this stress without yielding, eliminating the problems of buckling and developement of cracks and pinholes.

The following table contains published values of the yield stresses and endurance limits of three different aluminum alloys in the annealed, half hard and full hard conditions.

|  | type 1100 | type 3003 | type 5052 |
|---|---|---|---|
| Yield Stress (psi) (at 24° C.) |  |  |  |
| Annealed | 5,000 | 6,000 | 13,000 |
| Half Hard | 17,000 | 21,000 | 31,000 |
| Full Hard | 22,000 | 27,000 | 37,000 |
| Endurance Limit (psi) |  |  |  |
| Annealed | 5,000 | 7,000 | 16,000 |
| Half Hard | 7,000 | 9,000 | 18,000 |
| Full Hard | 9,000 | 10,000 | 20,000 |

From the foregoing table it is clear that the strength properties of the three listed alloys in the hardened conditions are substantially increased over those in the annealed conditions. These enhanced mechanical properties account for the advantageous results achieved with the hardened foil sheet 22 described above, eliminating a major problem encountered in the production of foil-backed solar panels.

It will be understood that half hard and full hard aluminum foil, while less commonly encountered commercially than annealed foil, are not appreciably more expensive than annealed foil. This is due to the fact that all aluminum foil is formed by rolling extruded aluminum stock to a desired thickness. The rolling process works the metal, leaving it in a hardened condition. Nonhardened foil is obtained by a further annealing process to remove the stresses worked into it. Commercially available hardened aluminum foil is produced by omitting or modifying the annealed process and substituting a wash step to remove oil and contaminants which would otherwise have been burned off by annealing.

It has been found that aluminum foils less than 0.001 inches thick can have pinholes which are difficult to detect and can defeat the hermetic seal formed thereby. The foil of the present invention is thus preferably at least 0.001 inches thick, and may be either full hard or half hard depending upon the yield strength and endurance limit required.

The effectiveness of hardened aluminum foil to eliminate the problems described above has been demonstrated by bonding 0.001 inch thick full hard sheets of type 1100 aluminum foil to sections of glass and subjecting the laminates to thermal cycling. The foil sheets were laminated between a pair of 1.5 mil thick oriented films of white polyvinyl fluoride resin, and bonded to glass through a 30 mil thick layer of plasticized PVB.

Foil layers and glass sheets four feet long were used for test purposes, and both annealed and full hard foil sheets were tested. After being subjected to 50 thermal cycles between −40 degrees Celsius and +90 degrees Celsius, the annealed foil sheets showed considerable buckling and stretching while the full hard foil sheets remained flat.

From the above, it can be seen that there has been provided an improved solar panel having a hardened aluminum foil back layer able to withstand extreme thermal cycling while remaining flat and maintaining an effective hermetic seal.

What is claimed is:

1. A solar panel comprising:
    at least one solar cell; and
    a sheet of hardened aluminum foil behind the cell and bonded thereto.

2. A solar panel comprising:
    at least one solar cell;
    a rigid transparent sheet overlying the cell; and
    a sheet of hardened aluminum foil beneath the cell and bonded to the cell and to the transparent sheet.

3. The solar panel recited in claim 2 wherein the panel includes upper and lower surfaces and the foil sheet provides a hermetic seal along a portion of the lower surface.

4. The solar panel recited in claim 3 wherein the foil sheet comprises type 1100 aluminum.

5. The solar panel recited in claim 3 wherein the foil sheet comprises type 3003 aluminum.

6. The solar panel recited in claim 3 wherein the foil sheet comprises type 5052 aluminum.

7. The solar panel recited in claim 3 wherein the foil sheet comprises full hard aluminum.

8. The solar panel recited in claim 3 wherein the foil sheet comprises half hard aluminum.

9. The solar panel recited in claim 3 wherein the solar cell is at least partially embedded in a dielectric layer and the foil sheet is bonded to the cell through the dielectric layer.

10. The solar panel recited in claim 3 wherein the foil sheet is laminated between a pair of dielectric sheets.

11. The solar panel recited in claim 3 which includes an electrically conductive peripheral frame, the foil sheet being grounded to the frame.

* * * * *